(12) United States Patent
Tanaka

(10) Patent No.: US 6,227,870 B1
(45) Date of Patent: May 8, 2001

(54) CONNECTING TERMINAL AND A CONNECTING TERMINAL ASSEMBLY

(75) Inventor: Ryoji Tanaka, Kawagoe (JP)

(73) Assignee: Kyoshin Kogyo Co., Ltd., Tokyo (JP)

( * ) Notice: Subject to any disclaimer, the term of this patent is extended or adjusted under 35 U.S.C. 154(b) by 0 days.

(21) Appl. No.: 09/373,536

(22) Filed: Aug. 13, 1999

(30) Foreign Application Priority Data

May 7, 1999 (JP) ................................. 11-127671

(51) Int. Cl.$^7$ .............................. H01R 12/00; H05K 1/00
(52) U.S. Cl. ............................ 439/66; 439/940; 361/395
(58) Field of Search ............................... 439/66, 862, 81, 439/940; 361/395

(56) References Cited

U.S. PATENT DOCUMENTS

| | | | |
|---|---|---|---|
| 3,474,380 | * 10/1969 | Miller | 439/752 |
| 4,553,192 | * 11/1985 | Babuka et al. | 361/743 |
| 4,664,458 | * 5/1987 | Worth | 439/82 |

FOREIGN PATENT DOCUMENTS 9115574   5/1997   (JP) .

* cited by examiner

Primary Examiner—Tulsidas Patel
Assistant Examiner—Brian S. Webb

(57) ABSTRACT

A connecting terminal assembly, including a covering tape heat-sealed to a mount base so as to cover a number of connecting terminals received in recessed portions of the mount base, is mounted to a surface mounter. Each connecting terminal has two fixed-contact sections, and a central section thereof having leg portions vertically extending from inner ends of the fixed-contact sections and a major portion extending between upper ends of the leg portions. Free-contact sections extend from outer ends of the fixed-contact sections vertically of and longitudinally in an inward direction of the connecting terminal. While the covering tape is being peeled off, each of the connecting terminals received in the recessed portions of the mount base is picked up at its major portion by suction and transferred to be positioned on a first printed circuit board at a desired position and with a desired orientation, by mean of a suction nozzle of the mounter. The connecting terminal having its fixed-contact sections separated by the central section is electrically connected to conductor portions of the circuit board, without being displaced on molten solder. By pressing a second printed circuit board against the free-contact sections to flex them, electrical connection is established therebetween with a sufficient contact pressure.

7 Claims, 4 Drawing Sheets

CONNECTING TERMINAL AND A CONNECTING TERMINAL ASSEMBLY

BACKGROUND OF THE INVENTION

1. Technical Field

The present invention relates to a connecting terminal for establishing electrical connection between conductor portions of printed circuit boards disposed in a facing relation, and relates to a connecting terminal assembly comprised of a plurality of connecting terminals that are removably attached to a mount base and adapted to be mounted on printed circuit boards with use of an automatic loader.

2. Related Arts

Electronic equipment, such as personal computers and telephone sets, accommodates therein a large number of electronic component parts. Typically, these components parts are mounted on a plurality of printed circuit boards that are accommodated in a cabinet of the electronic equipment. To reduce a space required for installation of the printed circuit boards in the cabinet and to facilitate easy assembly, these circuit boards are disposed in the cabinet in a facing relation to one another. In order to establish electric connection between conductive patterns respectively formed in adjacent printed circuit boards, connecting terminals, such as one disclosed in Japanese provisional patent publication no. 9-115574, have been employed.

This conventional connecting terminal is comprised of a U-shaped metal plate fabricated by bending an elongated plate, punched out from a metal sheet having upper and lower surfaces thereof plated in advance, into a U-shape, as shown in FIG. 9. The connecting terminal, having a first contact section 51 thereof formed by a longer half of the U-shaped plate, is adapted to be soldered at this contact section 51 to a conductor pattern (not shown) of a first printed circuit board 53. To this end, a first and second soldered-connection portions 51a, 51b are formed in the contact section 51 by cutting and upwardly raising a longitudinally intermediate portion and an outer end portion of the contact section 51. These soldered-connection portions 51a, 51b of the connecting terminal 50 are soldered to the conductor pattern of the first printed circuit board 53, whereby the connecting terminal 50 is electrically and mechanically connected to the conductor pattern of the printed circuit board 53. Subsequently, a second contact section 52, formed by a shorter half of the U-shape plate, of the connecting terminal 50 is abutted against a conductor pattern formed in a second printed circuit board 54, so as to be electrically connected thereto. In this manner, electrical connection between the conductor patterns of the first and second circuit boards 53, 54 is established through the connecting terminal 50 having the first fixed-contact section 51 and the second free-contact section 52 elastically flexible relative to the contact section 51.

To ensure that the connecting terminal 50 is properly joined to the printed circuit board 53, with an intended orientation and at an intended position thereon, the soldered-connection portions 51a, 51b of the connecting terminal 50 must be separated at a distance from each other and soldering flux or paste must be applied to surface areas of the conductor pattern of the first printed circuit board 53 that are apart from each other at a distance corresponding to the distance between the soldered-connection portions 51a, 51b. This requirement must be satisfied, especially when the connecting terminal 50 is soldered to the printed circuit board 53 in term of reflowing-type soldering.

If the soldering-flux applied areas of the printed circuit board 53 are not separated at a required distance but form a single area wide enough to cover a longitudinal zone including lengthwise portions of the circuit board 53 which respectively correspond to the soldered-connection portions 51a, 51b of the connecting terminal 50, molten solder flows into between the opposed flat surfaces of the first contact section 51 of the connecting terminal 50 and the printed circuit board 53 during the soldering process in term of reflowing-type soldering or the like. As a result, the connecting terminal 50 may be in a floated state on the molten solder, since the circuit-board-side surface of the first contact section 51 is formed, as a whole, into a single flat plane. In such a floated state, the connecting terminal 50 can be directed to an unexpected orientation, and thus the connecting terminal 50 is sometimes joined, with an undesired orientation, to the printed circuit board 53 after the solder is solidified.

In surface-mounting the connecting terminal 50 to the printed circuit board 53, a suction pickup device is often employed to pick up the connecting terminal by suction and transport the same to the circuit board. In this case, an upper face of the first contact section 51 of the connecting terminal 50 serves as a pickup face to which a suction nozzle of the pickup device is positioned. At the time of picking up the connecting terminal 50, a movable part, including the suction nozzle, of the suction device is moved toward the connecting terminal 50 to permit the suction nozzle to be positioned to the pickup face. To avoid interference between the connecting terminal 50 and the movable part of the pickup device moved toward the connecting terminal 50, the second contact section 52 of the connecting terminal, extending upward from the first contact section 51 toward the suction device, is bent at its proximal end so as to extend at an acute angle with respect to the first contact section 51.

As the acute angle formed between the first and second contact sections 51, 52 becomes small, the vertical dimension of the connecting terminal 50 becomes smaller. In order to electrically connect the circuit boards through such a low-profile connecting terminal 50, the printed circuit boards must be disposed close to each other at a small distance. In other words, electric connection between the printed circuit boards cannot be established with use of the connecting terminal 50, if one or more electric component parts, having a height greater than that of the connecting terminal 50, are mounted to either one or both of the printed circuit boards.

Since the second contact section 52 of the connecting terminal 50 extends at an acute angle with respect to the first contact section 51, the second contact section 52 can be flexed insufficiently in the vertical direction of the connecting terminal 50 when the second printed circuit board 54 is brought in urged contact with the second contact section 52. In this case, a contact force large enough to eliminate a layer of oxide film or the like, if any, on the conductor pattern cannot be produced between a conductor patter 54p of the printed circuit board 54 and the second contact section 52, so that defective electric connection may be caused between the printed circuit board 54 and the second contact section 52.

Furthermore, the conventional connecting terminal 50 can be unsatisfactorily sucked by the suction pickup nozzle so that it may drop therefrom during the picking-up and transfer processes, since the center of the pickup face of the first contact section 51 is deviated from the center of gravity of the connecting terminal 50 whose first contact section 51 is provided at only one end with the second contact section 52.

SUMMARY OF THE INVENTION

An object of the present invention is to provide a connecting terminal that can be easily surface-mounted on and accurately joined to a printed circuit board with an intended orientation and at an intended position thereon.

According to one aspect of the present invention, there is provided a connecting terminal, interposed between a first and second printed circuit boards facing each other, for establishing electric connection between conductor portions respectively formed in the first and second printed circuit boards.

The connecting terminal of this invention comprises a central section having a major portion thereof extending longitudinally of the connecting terminal at a vertically intermediate position in the connecting terminal, a first fixed-contact section extending outwardly longitudinally of the connecting terminal from a corresponding one of longitudinally outer ends of the central section, a second fixed-contact section extending outwardly longitudinally of the connecting terminal from another longitudinally outer end of the central section, each of the first and second fixed-contact sections being disposed at a vertical position on the side close to the first printed circuit board with respect to the major portion of the central section and being adapted to be joined to a corresponding one of first and second conductor portions of the first printed circuit board, and at least one free-contact section extending from at least one of longitudinally outer ends of the first and second fixed-contact sections, said free-contact section extending inwardly and longitudinally of the connecting terminal and extending vertically of the connecting terminal toward the second printed circuit board, said free-contact section being adapted to be elastically flexed in the vertical direction of the connecting terminal when it is in contact with the conductor portion of the second printed circuit board.

According to the connecting terminal of this invention, in a condition that the first and second fixed-contact sections are in contact with the first and second conductor portions of the first printed circuit board, the major portion of the central section of the connecting terminal is apart from the conductor portions of the first printed circuit board as viewed in the vertical direction of the connecting terminal. In other words, the connecting terminal is formed into such a shape that a longitudinally central part of its face on the first-printed-circuit-board side is out of contact with the first printed circuit board. For this reason, in the case of soldering the connecting terminal to the first printed circuit board by means of, e.g., reflowing-type soldering, molten solder congregates, attributable to its surface tension, around locations at which the fixed-contact sections of the connecting terminal are in contact with the conductor portions of the first printed circuit board. Hence, a flow of molten solder is disconnected between the first and second conductor portions of the first printed circuit board or between the first and second fixed-contact sections of the connecting terminal, even if soldering paste or solder containing soldering paste is applied to the conductor-pattern-side face of the first printed circuit board over the entirety of a longitudinal region thereof wide enough to extend between the first and second conductor portions of the circuit board.

In this manner, molten solder does not flow into between the entirety of opposed faces of the connecting terminal and the first printed circuit board, irrespective of how soldering paste or solder containing the same is applied to the circuit board. Thus, the connecting terminal will never be in a floated state on the molten solder during the soldering process. This makes it possible to join the connecting terminal to the conductor pattern of the first printed circuit board at a desired position and with a desired orientation, once the connecting terminal has been placed thereon at such a position and with such an orientation.

Upon surface-mounting the connecting terminal on the first printed circuit board, a suction pickup device is typically used to pick up the connecting terminal by suction and transfer the same to the printed circuit board. In this case, a surface of the major portion of the central section of the connecting terminal serves as a pickup face. The suction-holding of the connecting terminal may be achieved by moving a suction nozzle of the pickup device by a short distance to the major portion located at a location short of the fixed-contact sections in the vertical direction of the connecting terminal. This moderates the requirement of acutely bending the free-contact section at its proximal end relative to the associated fixed-contact section to the extent that interference between the connecting terminal and a movable part, including the suction nozzle, of the pickup device is prevented.

In this manner, the angle formed between the free-contact section and the fixed-contact section can be made relatively large, and hence the vertical distance between an outer end of the free-contact section and the fixed-contact section can be made larger. As a result, electric connection between the first and second printed circuit boards can be established with use of the connecting terminal disposed therebetween, even if the first and second printed circuit boards must be disposed at a relatively large distance for the reason that one or more large vertical-size component parts are mounted on one or both of the first and second printed circuit boards or other reasons.

In addition, the vertical distance between the outer end of the free-contact section and the fixed-contact section is large enough to permit the free-contact section to sufficiently flex around the boundary between the free-contact section and the fixed-contact section. That is, by bringing the second printed circuit board in contact with the outer end of the free-contact section and by further moving the circuit board toward the fixed-contact section, the free-contact section can be sufficiently flexed in the vertical direction of the connecting terminal. As a consequence, the free-contact section of the connecting terminal is brought in urged contact with the conductor pattern of the second printed circuit board with a sufficient contact pressure, thereby establishing proper electrical connection between the connecting terminal and the second printed circuit board.

Furthermore, since the first and second fixed-contact sections are formed on the opposite ends of the major portion of the central section of the connecting terminal, the geometrical center of the major portion of the central section can be made close to the center of gravity of the connecting terminal. For this reason, when the connecting terminal is picked up by suction and transferred toward the first printed circuit board by use of a suction pickup device, while utilizing, as pickup face, the outer face of the major portion of the central section, the connecting terminal can be positively held by the suction pickup device and prevented from dropping therefrom during the suction and transfer processes.

In the present invention, preferably, the connecting terminal is fabricated by bending an elongated metal plate punched out from a metal sheet. The central section, the first and second fixed-contact sections, and the free-contact section of the connecting terminal are formed of a single piece.

With this preferred arrangement, the connecting terminal can be fabricated efficiently and easily at low costs and can be light in weight and still having required mechanical strength.

Preferably, the central section of the connecting terminal includes a first and second leg portions respectively extending vertically with respect to the connecting terminal from the longitudinal ends of the major portion of the central section to inner longitudinal ends of the first and second fixed-contact sections.

With this preferred arrangement, the major portion of the central section of the connecting terminal can be positively disposed at an intermediate position in the vertical direction of the connecting terminal. This facilitates, for instance, soldering the connecting terminal to the conductor pattern of the first printed circuit board at a desired position and with a desired orientation, for the reason mentioned above.

Preferably, the at least one free-contact section is comprised of a first and second free-contact sections extending from longitudinally outer ends of the first and second fixed-contact sections, respectively.

With this preferable arrangement, the connecting terminal has the first free- and fixed-contact sections that are symmetric with the second free- and fixed contact sections with respect to the central section, so that the center of the major portion of the central section may be made closer to the centroid position of the connecting terminal. For this reason, when the connecting terminal is picked up and transferred to the first printed circuit board by use of a suction pickup device having a nozzle thereof positioned to the major portion of the connecting terminal, the connecting terminal can be prevented from dropping therefrom during the suction and transfer processes.

Preferably, the first and second fixed-contact sections are respectively formed with first and second grooves extending therethrough in the thickness direction of the fixed-contact sections.

With this preferred arrangement, when the fixed-contact sections are soldered to the conductor pattern of the first printed circuit board, molten solder flows into the grooves of the fixed-contact sections and is then solidified, so that the connecting terminal may be securely joined to the conductor pattern of the first printed circuit board.

More preferably, each of the first and second grooves is comprised of a plurality of slots.

With this preferred arrangement, an increased solder-connection area is provided by the grooves of the fixed-contact sections, so that the connecting terminal can be reliably joined to the conductor patterns of the first printed circuit board.

In the aforementioned preferred arrangement having the central section comprised of the major portion and the leg portions, preferably, the first and second grooves extend from inner longitudinal end portions of the first and second fixed-contact sections to vertical end portions, on the first-printed-circuit-board side, of the first and second leg portions, respectively.

With this arrangement, a solder-connection area provided by the grooves increases, and the grooves are formed at such locations as to effectively contribute to solder-connection between the connecting terminal and the conductor patterns of the first printed circuit board. This makes it possible to securely join the connecting terminal to the conductor patterns of the first printed circuit board.

According to another aspect of the present invention, there is provided a connecting terminal assembly which comprises a mount base formed with a plurality of holes which are spaced at a predetermined regular distance and to which feed pawls of an automatic loader are individually engaged, and a plurality of connecting terminals removably mounted on the mount base at the predetermined regular distance. Each of the plurality of connecting terminals is constructed in the same manner as the aforementioned connecting terminal.

With the connecting terminal assembly of this invention, connecting terminals can be automatically mounted to printed circuit boards with use of an automatic loader, without the need of a manual mounting operation. In the case of fabricating the connecting terminals by bending elongated metal plates punched off from a metal sheet, these metal plates can be punched off from those parts of the metal sheet which are separated from one another at a distance shorter than the distance between adjacent connecting terminals on the mount base. This makes it possible to improve the efficiency in utilizing the metal sheet, so that connecting terminals may be fabricated at low costs.

Preferably, recessed portions for receiving the plurality of connecting terminals are formed in the mount base at the predetermined regular distance.

With this arrangement, connecting terminals are positively held in the recessed portions formed in the mount base.

Preferably, a covering tape is attached to the mount base so as to cover the plurality of connecting terminals received in the recessed portions of the mount base.

With this arrangement, each of the connecting terminals can be held in the recessed portions of the mount base with reliability and can be easily dismounted therefrom while a corresponding part of the covering tape is peeled off from the mount base.

DETAILED DESCRIPTION

With reference to FIGS. 1–5, a connecting terminal according to an embodiment of the present invention will be explained.

Figure 1:
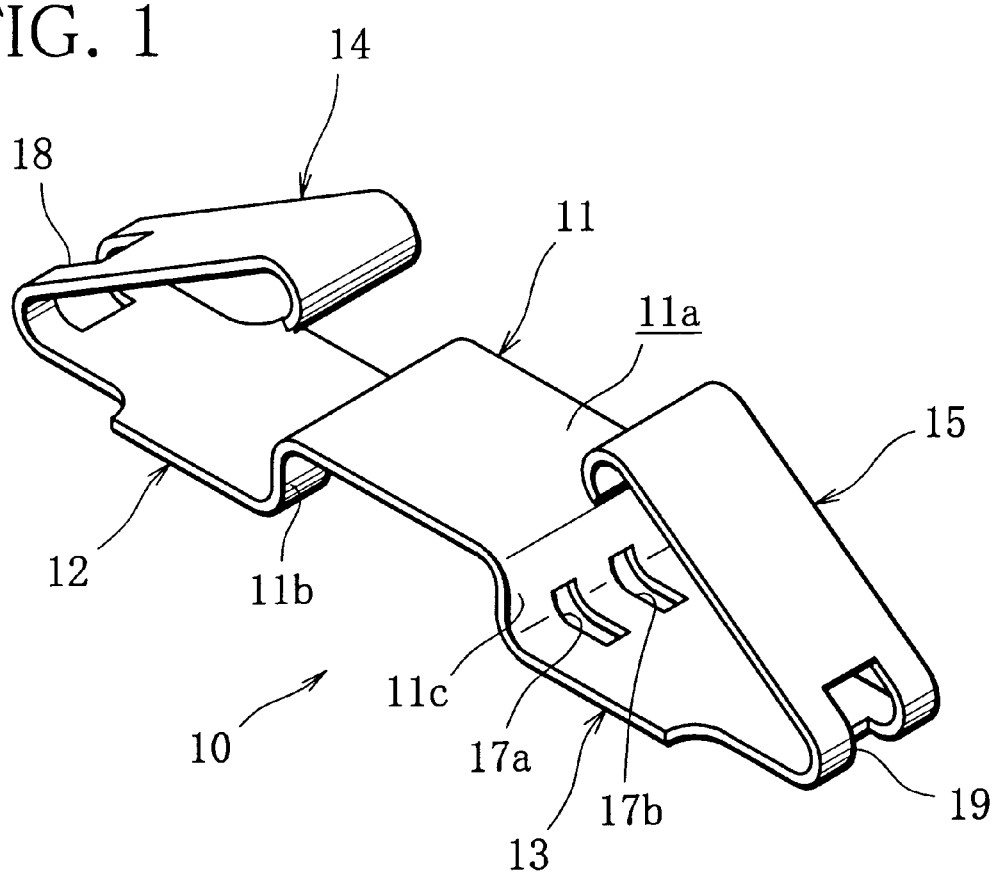
FIG. 1 is a perspective view of a connecting terminal according to an embodiment of the present invention.

A connecting terminal 10 of this embodiment is fabricated by bending an elongated thin metal plate, punched out from a metal sheet having high electric conductivity, by means of a press molding machine. The thin metal plate, not shown, corresponds in shape and size to a development of the contact terminal 10. As shown in FIG. 1, the connecting terminal 10 is comprised of a central section 11, first and second fixed-contact sections 12, 13 respectively extending longitudinally outwardly of the connecting terminal and integrally therewith from both ends of the central section 11, and first and second free-contact sections 14, 15 respectively extending obliquely integrally from outer ends of the fixed-contact sections 12, 13. The connecting terminal 10, comprised of these elements 11–15 and formed into one piece, is adapted to be fixed at the fixed-contact sections 12, 13 to a first printed circuit board 21 and to be brought in contact at the free-contact sections 14, 15 with a second printed circuit board 22.

The central section 11 of the connecting terminal 10 is, as a whole, formed into a squarish inverted U-shape in longitudinal cross section. The central section 11 is comprised of a major portion 11a thereof extending longitudinally of the connecting terminal 10 at a vertically intermediate position in the connecting terminal, and a first and second leg portions 11b, 11c formed integrally with the major portion 11a. The leg portions 11b and 11c extend vertically in a downward direction of the connecting terminal 10 from opposite ends of the major portion 11a of the central section 11, respectively, and are formed integrally with the major portion 11a. The major portion 11a is separated from the fixed-contact sections 12, 13 at a predetermined distance in the vertical direction of the connecting terminal 10 and extend in parallel to the contact sections 12, 13.

The connecting terminal 10 is adapted to be picked up by suction and transferred toward the first printed circuit board 21 by means of a suction pickup device, and the upper face of the major portion 11a of the central section 11 is configured to serve as a pickup face. In this connection, the upper face of the major portion 11a has its length and width which are greater than the diameter of a suction nozzle of the pickup device. The nozzle diameter is shown by two-dotted chain line in FIG. 3.

Figure 2:
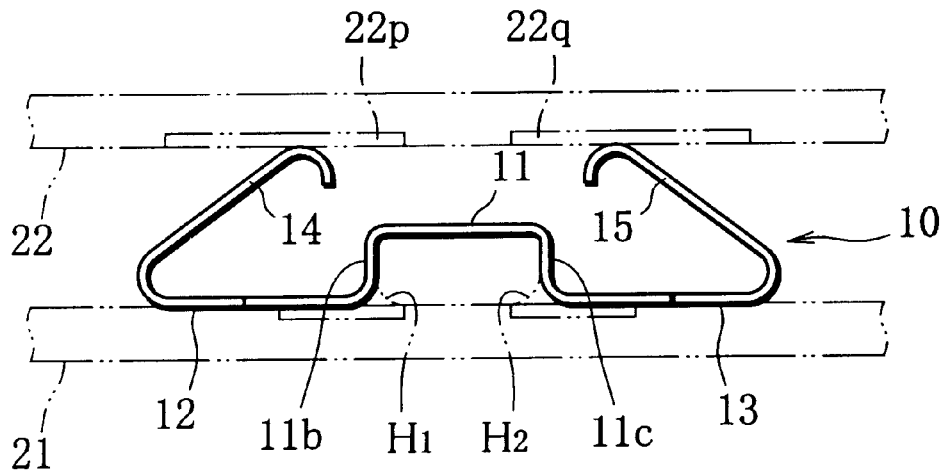
FIG. 2 is a front view of the connecting terminal shown in FIG. 1.

As shown in FIG. 2, the first and second fixed-contact sections 12, 13 extend outwardly, in a longitudinal direction, of the connecting terminal from lower ends of the leg portions 11b, 11c at substantially right angles with respect to the leg portions 11b and 11c, and are formed integrally with the leg portions, respectively. In other words, the fixed-contact sections 12, 13 are on the same plane and are separated from each other longitudinally of the connecting terminal 10, with the central section 11 sandwiched therebetween.

Figure 3:
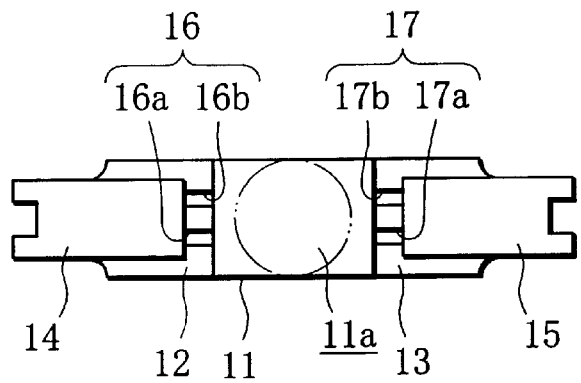
FIG. 3 is a plan view of the connecting terminal.
Figure 4:
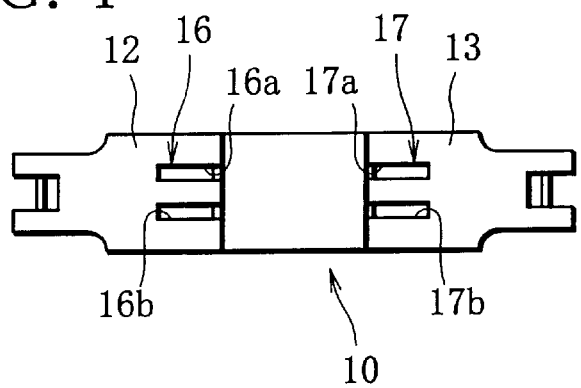
FIG. 4 is a bottom view of the connecting terminal.

As shown in FIGS. 1, 3 and 4, the first leg portion 11b of the central section 11 and the first fixed-contact section 12 are formed at their junction with a first groove 16 that are comprised of two parallel slots 16a and 16b. These slots 16a, 16b extend between a raised portion of the first leg portion 11b and an inner end portion of the first fixed-contact section 12. Similarly, a second groove 17, formed in a junction of the second leg portion 11c and the second fixed-contact section 13, is comprised of two parallel slots 17a and 17b extending between a raised portion of the second leg portion 11c and an inner end portion of the second fixed-contact section 13.

The first and second free-contact sections 14, 15 obliquely extend from outer ends of the first and second fixed-contact sections 12, 13, respectively. More specifically, each of the free-contact sections 12, 13 extends vertically of the connecting terminal 10 toward the second printed circuit board 22 and extends inwardly in a longitudinal direction of the connecting terminal 10. As compared with the case of the aforementioned conventional connecting terminal, the first and second free-contact sections 14, 15 extend at a not-so-acute angle with respect to the first and second fixed-contact sections 12 and 13, respectively, so that a substantially V-shape rather than a U-shape is formed between each free-contact section 14 or 15 and a corresponding one of the fixed-contact sections 12, 13. In a free state, the respective tip end portions or outer end portions of the first and second free-contact sections 14, 15 are at locations above the major portion 11a of the central section 11.

The free-contact sections 14, 15 are adapted to be elastically flexed toward the fixed-contact sections 12, 13 when the second printed circuit board 22 is brought in contact therewith. Each of the tip end portions of the free-contact sections 14, 15 is formed into an outwardly convex semicircular shape in longitudinal cross section, so that the tip end portions of the free-contact sections 14, 15 are properly applied with forces exerting in the vertical direction of the connecting terminal 10 when they are pressed by the second printed circuit board 22, thereby facilitating flexion of the free-contact sections 14, 15 toward the fixed-contact sections 12, 13.

As shown in FIG. 1, the first free-contact section 14 and the first fixed-contact section 12 are formed at their junction with a notch 18 extending longitudinally of the connecting terminal 10. A similar notch 19 is formed in a junction of the second free-contact section 15 and the second fixed-contact section 13. The provision of the notches 18, 19 makes it easy for the free-contact sections 14, 15 to flex.

Figure 5:
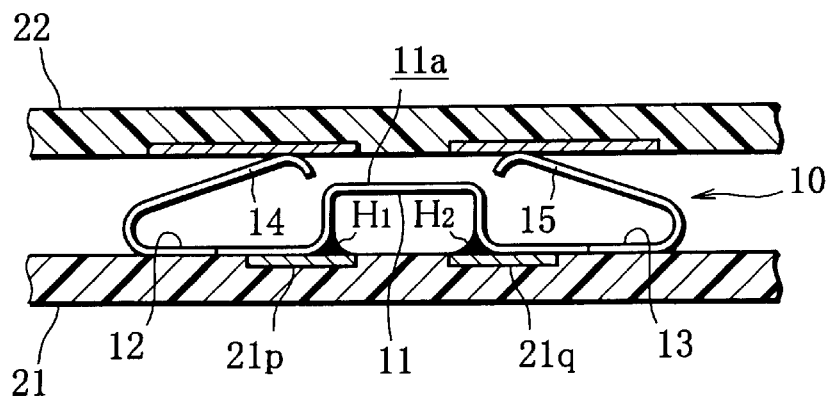
FIG. 5 is a front view showing the connecting terminal in a condition where two printed circuit boards are electrically connected through the connecting terminal.

The free-contact sections 14, 15 have their lengths short enough to prevent the tip end portions thereof from interfering with the central section 11 when they are fully flexed toward the fixed-contact sections 12 and 13, as shown in FIG. 5. Thus, the free-contact sections 14, 15 are enabled to flex to such an extent that their tip end portions can take vertical positions lower than the major portion 11a of the central section 11.

Figure 7:
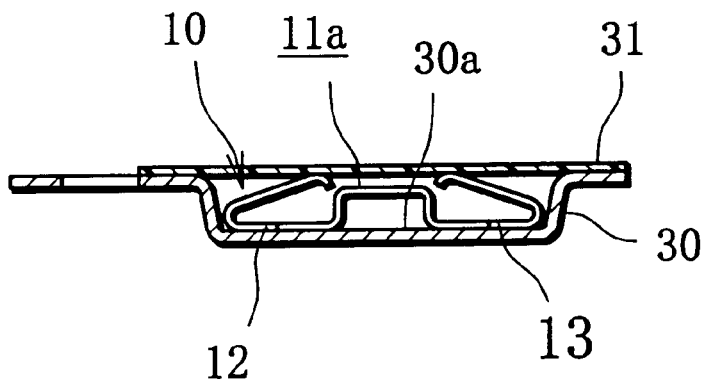
FIG. 7 is a cross sectional view of the connecting terminal assembly taken along line VII—VII in FIG. 6.
Figure 8:
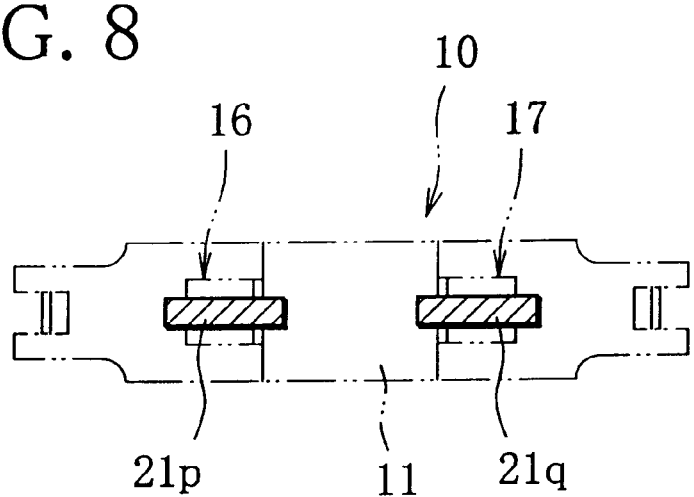
FIG. 8 is a view showing two conductor patterns which are formed in a printed circuit board and to which the connecting terminal shown in FIG. 1 is joined.
Figure 9:
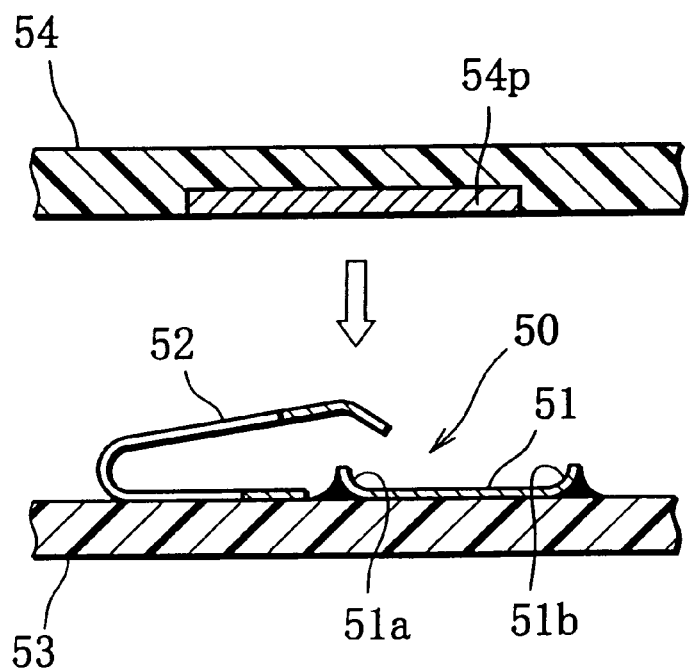
FIG. 9 is a front view of a conventional connecting terminal.

In order to mount a number of the aforementioned connecting terminals 10 to printed circuit boards with use of a surface mounter (more generally, an automatic loader), many connecting terminals 10 are mounted to an embossed carrier tape (mount base in general) 30 at a predetermined regular interval, thereby making it easy to handle the connecting terminals during the surface-mounting thereof. The embossed carrier tape 30 is preferably formed with recessed portions 30a at a predetermined distance that is the same as the interval of the connecting terminals on the tape 30. Each connecting terminal 10 is received in a corresponding one of the recessed portions 30a in such a manner that the longitudinal axis of the connecting terminal 10 is perpendicular to the longitudinal axis of the carrier tape 30 and the fixed-contact sections 12, 13 of the connecting terminal 10 are in contact with a bottom face of the recessed portion 30a, as shown in FIG. 7.

A covering tape 31 is heat-sealed to an upper face of the carrier tape 10 in which face the recessed portions 30a receiving the connecting terminals 10 are formed, whereby the connecting terminals are held by the covering tape 30 so as not to unintentionally dismounted from the carrier tape. The recessed portions 30a of the carrier tape 30 each have a depth substantially the same as a vertical size of the connecting terminals, so that the distal end portions of the free-contact sections 14, 15 of each connecting terminal 10 are flush with the outer face of the carrier tape 30. Thus, the covering tape 31 is in contact with surfaces of the distal end portions of the free-contact sections 14, 15, thereby securely hold the connecting terminals 10 within the recessed portions 30a.

Figure 6:
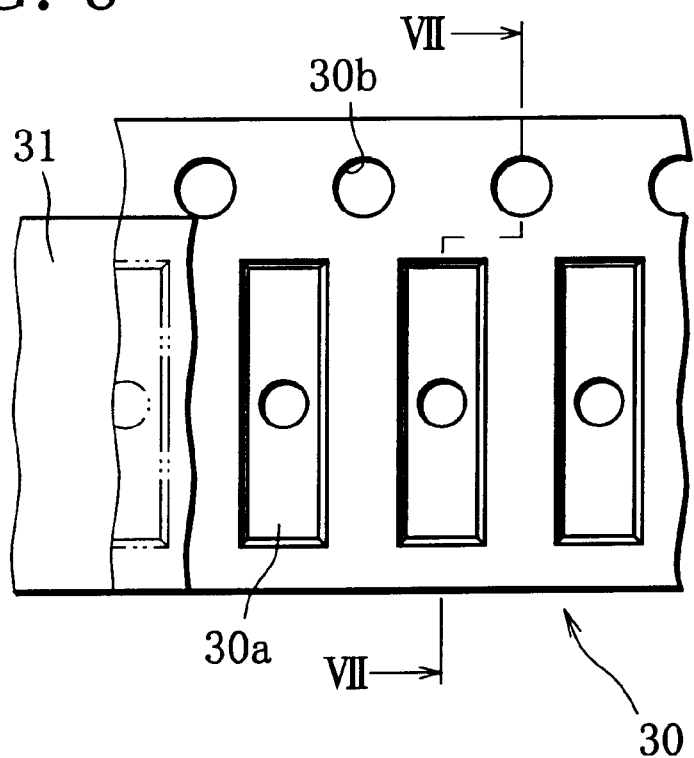
FIG. 6 is a view showing a connecting terminal assembly comprised of connecting terminals of a type shown in FIG. 1, which are attached to a mount base with a covering tape.

To mount the connecting terminals 10 to the first printed circuit board 21 shown by two-dotted chain line in FIG. 2, the embossed carrier tape 30 is mounted on an electronic-component-supplying section (not shown) of a surface mounter, and feed pawls of the component supplying section are individually engaged with circular feed holes 30b, shown in FIG. 6, of the carrier tape 30. Then, the component supplying section of the mounter is driven to deliver the carrier tape 30 with a predetermined pitch. While corresponding part of the covering tape 31 attached to the carrier tape 30 is being peeled off, the connecting terminals 10 received in the recessed portions 30a of the carrier tape 30 are taken out one by one with use of a suction pickup device having a suction nozzle for picking up each connecting terminal 10 by applying a suction force to the pickup face of the major portion 11a of the connecting terminal.

Since the major portion 11a, to which the suction nozzle is positioned, of the central section 11 of each connecting terminal 10 is located between the distal end portions of the free-contact sections 14, 15 in the longitudinal direction of the connecting terminal and located above the fixed-contact sections 12, 13 in the vertical direction thereof, the suction nozzle of the pickup device does not interfere with the distal end portions of the free-contact sections 14, 15 of the connecting terminal. Therefore, the pickup device is enabled to positively pick up the connecting terminals 10.

Subsequently, the thus suction-held connecting terminal 10 is transferred by the suction pickup device from within the recessed portion 30a of the carrier tape 30 to the first printed circuit board 21. Since the central section 11 of each connecting terminal is formed in a longitudinally center region of the connecting terminal and is formed at its both ends with the fixed-contact and free-contact sections 12, 13; 14, 15, each connecting terminal 10 is symmetric in construction with respect to the center of the major portion 11a. Thus, the center of gravity of the connecting terminal 10 substantially coincides with the center of the major portion 11a. This facilitates a well-balanced suction-holding of each connecting terminal 10 by the suction device, whereby the connecting terminal 10 can be prevented from falling from the suction nozzle during the course of transferring the connecting terminal to the first printed circuit board 21.

Subsequently, the connecting terminal 10 dismounted from the carrier tape 30 is mounted on the first printed circuit board 21. This mounting operation is implemented in such a manner that the grooves 16, 17 of the connecting terminal 10 are positioned at predetermined positions on conductor patterns 21p, 21q of the first printed circuit board 21, to which positions solder containing therein soldering flux is applied in advance.

After completion of mounting all the required electronic component parts and connecting terminals 10 on the first printed circuit board 21 with use of the surface mounter, this circuit board is inserted into a heating furnace, whereby the solder applied in advance to the circuit board is subject to heating.

During the heating, the solder is subject to remelting and flows into the grooves 16, 17 of each connecting terminal 10. Subsequently, the solder is solidified during a cooling process so that the connecting terminals are securely joined to the conductor patterns of the printed circuit board.

The fixed-contact sections 12, 13 of each connecting terminal 10 are apart from each other in the longitudinal direction of the connecting terminal, and the leg portions 11b, 11c are raised from the longitudinally inner ends of the fixed-contact sections 12, 13 in the vertical direction of the connecting terminal. Thus, solder-connection regions H1 and H2, partly shown in FIG. 5 and corresponding to coupling portions between the fixed-contact portions 12, 13 and the leg portions 11b, 11c, are separated from each other in the longitudinal direction of the connecting terminal. In this regard, a surface tension force of molten solder around the solder-connection region H1 and that of molten solder around the region H2 exert in opposite longitudinal directions from each other, to prevent the formation of a layer of molten solder continuously extending between the regions H1 and H2. As a result, the connecting terminal 10 is prevented from being in a floated state on such a continuous layer of molten solder, so that it may be prevented from being displaced from a desired position on the conductor pattern of the first printed circuit board 21.

Furthermore, the grooves 16, 17 each comprised of two parallel slots 16a, 16b; 17a, 17b provide increased solder areas for the solder-connection regions H1, H2 of the connecting terminal 10. As shown in FIG. 1, the grooves 16, 17 extend to lower end portions of the leg portions 11b, 11c of the central section 11 of the connecting terminal, the solder-connection regions H1, H2 expand up to raised portions of the leg portions 11b, 11c. For these reasons, the connecting terminal may be securely joined to the conductor patterns 21p, 21q of the first printed circuit board 21.

Even if the soldering plane to which solder containing solder flux is applied is continuously formed on a longitudinal region, including both the conductor patterns 21p, 21q, of the first printed circuit board 21 rather than it is separately formed on the conductor patterns 21p, 21q, the connecting terminal 10 is always soldered at the two solder-connection regions H1, H2 longitudinally apart from each other since the central section 11 is separated from the conductor patterns in the vertical direction of the connecting terminal. Thus, the connecting terminal 10 can be joined to the conductor patterns of the first printed circuit board 21 at a desired position and with a desired orientation.

In the above manner, the connecting terminal 10 can be accurately, securely and immediately mounted to the first printed circuit board 21 by means of surface-mounting and reflowing-type soldering.

Next, the second printed circuit board 22 is positioned in a facing relation with the first printed circuit board 21 on which the connecting terminal 10 is soldered. At this time, as shown in FIG. 2, the second printed circuit board 22 is first disposed such that the conductor patterns 22p, 22q of the second circuit board 22 are in contact with the free-contact sections 14, 15 of the connecting terminal 10, and in this state, the second circuit board 22 is moved toward the first circuit board 21 until the distance between the first and second circuit boards 21, 22 reduces to a predetermined distance shown in FIG. 5. Whereupon, the first and second circuit boards 21, 22 are fixed to each other with use of a fastening device, not shown.

During this time, the free-contact sections 14, 15 of the connecting terminal 10 are elastically flexed from a state shown in FIG. 2 where the conductor patterns 22p, 22q of the second circuit board 22 are in lightly contact with the free-contact sections to a state shown in FIG. 5 where the second circuit board 22 is fastened to the first circuit board 21. As the free-contact sections 14, 15 are flexed in this manner, the distal end portions of the free-contact sections 14, 15 are displaced so as to close to each other along the conductor patterns 22p, 22q of the second circuit board 22 while being kept in contact with these conductor patterns. As a result, proper electric connection is established between the free-contact sections 14, 15 and the conductor patterns 22p, 22q of the second circuit board 22.

If the second circuit board 22 is moved too close to the first circuit board 21, then the major portion 10a of the central section 11 of the connecting terminal 10 serves as a stopper that restricts a further vertically inward movement of the second circuit board 22. This prevents unusual deformation of the connecting terminal 10, which would be otherwise caused by such an excessive inward movement of the second circuit board 22, and prevents damage to electronic component parts mounted to the circuit board 21 or 22 around the connecting terminal 10 so long as these electronic components parts have their vertical sizes lower than the height of the major portion 11a of the central section 11 of the connecting terminal 10.

After completion of assembling the first and second circuit boards and the connecting terminal, the thus assembled printed circuit boards are accommodated in electric equipment with a desired orientation.

Connecting terminal 10 can be widely used as earth terminals or other terminals for establishing electric connection between conductor patterns formed in printed circuit boards disposed in a facing relation.

In the present invention, the provision of the first and second free-contact sections formed integrally with the first and second fixed-contact sections is not inevitably necessary. Alternatively, a single free-contact section may be formed integrally with either one of the fixed-contact sections although the provision of two pairs of free-contact and fixed-contact sections provides symmetric construction for the connecting terminal to achieve well-balanced suction-holding of the connecting terminal during the picking up and transfer processes.

Although the conductor patterns are separately formed in the first circuit board 21 from each other in the embodiment, the circuit board 21 may be formed with a unitary single conductor pattern. This is applied to the conductor patterns of the second circuit board 22.

What is claimed is:

1. A connecting terminal, interposed between a first and second printed circuit boards facing each other, for establishing electric connection between conductor portions respectively formed in the first and second printed circuit boards, comprising:

a central section having a major portion thereof extending in a longitudinal direction of the connecting terminal at a vertically intermediate position in the connecting terminal;

a first fixed-contact section extending outwardly in the longitudinal direction of the connecting terminal from a corresponding one of longitudinally outer ends of said central section, an entire portion of said first fixed-contact section being flat and parallel to the central section;

a second fixed-contact section extending outwardly in the longitudinal direction of the connecting terminal from another longitudinally outer end of said central section, an entire portion of said second fixed-contact section being flat and parallel to the central section, each of first and second fixed-contact sections being disposed at a vertical position on a side close to the first printed circuit board with respect to said major portion of said central section and the entire portion of said first and second fixed-contact sections being adapted to be joined to a corresponding one of said first and second conductor portions of the first printed circuit board; and at least one free-contact section extending from at least one of longitudinally outer ends of said first and second fixed-contact sections, said free-contact section extending inwardly in the longitudinal direction of the connecting terminal and extending vertically of the connecting terminal toward the second printed circuit board, said at least one free-contact section being adapted to be elastically flexed in a vertical direction of the connecting terminal when it is in contact with the conductor portion of the second printed circuit board.

2. The connecting terminal according to claim 1, wherein the connecting terminal is fabricated by bending an elongated metal plate punched out from a metal sheet, and said central section, said first and second fixed-contact sections, and said free-contact section of the connecting terminal are formed into one piece.

3. The connecting terminal according to claim 1, wherein said central section of the connecting terminal includes a first and second leg portions respectively extending vertically of the connecting terminal from longitudinal ends of said major portion of said central section to inner longitudinal ends of said first and second fixed-contact sections.

4. The connecting terminal according to claim 1, wherein said at least one free-contact section is comprised of a first and second free-contact sections extending from longitudinally outer ends of said first and second fixed-contact sections, respectively.

5. The connecting terminal according to claim 1, wherein said first and second fixed-contact sections are respectively formed with a first and second grooves extending therethrough in a thickness direction of said fixed-contact sections.

6. The connecting terminal according to claim 5, wherein each of said first and second grooves is comprised of a plurality of slots.

7. The connecting terminal according to claim 3, wherein said first and second fixed-contact sections are respectively formed with first and second grooves extending therethrough, and said first and second grooves extend from inner longitudinal end portions of said first and second fixed-contact sections to vertical end portions, on a first-printed-circuit-board side, of said first and second leg portions, respectively.

* * * * *